US012676608B2

(12) United States Patent (10) Patent No.: US 12,676,608 B2
Meiler et al. (45) Date of Patent: Jul. 7, 2026

(54) METHOD FOR THE OPERATING-POINT-DEPENDENT ACTUATION OF A TOPOLOGICAL SEMICONDUCTOR SWITCH FOR A POWER ELECTRONICS SYSTEM

(71) Applicant: ZF Friedrichshafen AG, Friedrichshafen (DE)

(72) Inventors: Michael Meiler, Bayreuth (DE); Teresa Bertelshofer, Bayreuth (DE)

(73) Assignee: ZF Friedrichshafen AG, Friedrichshafen (DE)

( * ) Notice: Subject to any disclaimer, the term of this patent is extended or adjusted under 35 U.S.C. 154(b) by 2 days.

(21) Appl. No.: 18/579,184

(22) PCT Filed: Jul. 11, 2022

(86) PCT No.: PCT/EP2022/069313
§ 371 (c)(1),
(2) Date: Jan. 12, 2024

(87) PCT Pub. No.: WO2023/285376
PCT Pub. Date: Jan. 19, 2023

(65) Prior Publication Data
US 2024/0348245 A1 Oct. 17, 2024

(30) Foreign Application Priority Data
Jul. 12, 2021 (DE) ..................... 10 2021 207 312.3

(51) Int. Cl.
*H03K 17/00* (2006.01)
*H03K 17/12* (2006.01)
*H03K 17/30* (2006.01)

(52) U.S. Cl.
CPC ......... *H03K 17/122* (2013.01); *H03K 17/127* (2013.01); *H03K 17/302* (2013.01)

(58) Field of Classification Search
CPC .. H03K 17/122; H03K 17/127; H03K 17/302; H03K 17/567; H03K 2217/0027
See application file for complete search history.

(56) References Cited

U.S. PATENT DOCUMENTS 9,753,476 B1 * 9/2017 Shukla ..................... G05F 1/562
2013/0257177 A1 * 10/2013 Jacobson ......... H03K 17/04123
307/115

(Continued)

FOREIGN PATENT DOCUMENTS

DE 10 2016 219 098 A1 4/2018
DE 10 2017 105 712 A1 10/2018

(Continued)

OTHER PUBLICATIONS

International Search Report and Written Opinion received for Application No. PCT/EP2022/069313 mailed Nov. 15, 2022 (14 pages).

(Continued)

*Primary Examiner* — Tuan T Lam
(74) *Attorney, Agent, or Firm* — Crowell & Moring LLP

(57) ABSTRACT

A method for the operating point-dependent actuation of a topological semiconductor switch for a power electronics system is proposed, in which the topological semiconductor switch is divided into at least two groups of power semiconductors made of different semiconductor materials and/ or types of semiconductors. A switching threshold is also defined, at which switching from one group to another group, or adding at least one other group to the active group of topological semiconductor switches, takes place in order to conduct the output electricity. Furthermore, data for at least one physical value that describes the operating state of the system is obtained as input data and averaged. It is determined on the basis of this data and the switching (Continued)

threshold, which of the at least two groups of power semi-conductors are actuated to conduct the output electricity.

11 Claims, 1 Drawing Sheet

(56) References Cited

U.S. PATENT DOCUMENTS

| | | | | |
|---|---|---|---|---|
| 2016/0021189 A1* | 1/2016 | Kumar | | H04W 4/70 |
| | | | | 709/231 |
| 2016/0035835 A1* | 2/2016 | Mohai | | H10D 89/911 |
| | | | | 257/139 |
| 2023/0421149 A1* | 12/2023 | Hain | | H03K 17/122 |
| 2024/0048141 A1* | 2/2024 | Hohmann | | H03K 17/127 |
| 2024/0088889 A1* | 3/2024 | Hohmann | | H03K 17/127 |
| 2024/0171157 A1* | 5/2024 | Alisar | | H03K 17/14 |

FOREIGN PATENT DOCUMENTS

| | | | |
|---|---|---|---|
| EP | 3 748 794 A1 | 12/2020 | |
| WO | WO 2016/014907 A1 | 1/2016 | |

OTHER PUBLICATIONS

Office Action dated Apr. 12, 2022 for German Patent Application No. 10 2021 207 312.3 (16 pp.), note: pp. 1 and 2 are English language Explanations to Section C. Result of Determination Document.

Proakis, John G., Ph.D., P.E., *Digital Communications, Third Edition*, Passage, Digital Communications; [Electrical and Computer Engineering. Communications and Signal Processing], McGraw Hill, New York, Jan. 1, 1995 (Jan. 1, 1995), ISBN: 0-07-051726-6 (6 pp.).

* cited by examiner

METHOD FOR THE OPERATING-POINT-DEPENDENT ACTUATION OF A TOPOLOGICAL SEMICONDUCTOR SWITCH FOR A POWER ELECTRONICS SYSTEM

CROSS-REFERENCE TO RELATED APPLICATIONS

This application is a U.S. national stage application under 35 U.S.C. § 371 of PCT Application No. PCT/EP2022/069313, filed on Jul. 11, 2022, and published as WO 2023/285376 A1 on Jan. 19, 2023, which claims priority from German Application No. 10 2021 207 312.3, filed on Jul. 12, 2021, the entirety of which are each hereby fully incorporated by reference herein.

The present invention relates to the field of electric mobility, in particular a method for operating point-dependent actuation of a topological semiconductor switch for a power electronics system.

Semiconductor transistors are used in numerous fields as electronic switches and referred to as semiconductor switches. This is because a semiconductor switch can be switched back and forth between two states. A first state is when it is switched on. The semiconductor switch can conduct electricity in this state, and behave like a low resistor or diode in the forward direction. The other state is when it is off. In this state, the semiconductor switch can receive a voltage of, e.g., 400V or 800V.

Semiconductor switches can be switched on and off very quickly and efficiently. This switching is the basis for many electronic circuits, e.g. power supplies, converters, rectifiers, and inverters.

A control port, the so-called gate driver, is what makes it possible to switch the semiconductor switch off and on. There are two basic types of semiconductor switches. These are voltage-controlled semiconductor switches and current-controlled semiconductor switches. For the voltage-controlled semiconductor switches, the voltage must be above or below a defined level, e.g. +5V or −3V, to switch the semiconductor on or off. With current-controlled semiconductor switches, the current must be above or below a defined current to switch the semiconductor switch on or off.

A control circuit with which the semiconductor switch is switched on and off is needed for both versions.

Control circuits or control assemblies have an input side and an output side. The input side has at least one signal value that contains information regarding whether the semiconductor switch is to be switched on or off. The input and output sides of the control assembly can also be insulated from one another. The output side has at least one output signal, which responds to voltage levels, amperages, etc. such that the semiconductor switch can be actuated with this signal.

The applicant has already proposed an assembly for a topological switch that has at least two power semiconductors, in particular power transistors, the semiconductor switch for which has at least one first power semiconductor with a first semiconductor material, and at least one second power semiconductor with a second semiconductor material.

These actuation assemblies can only be used for topological semiconductor switches that are made of the same types of semiconductor switches. With a topological switch comprising a parallel connection of different semiconductor materials with large bandgaps, e.g. SiC, GaN, Si, etc. and/or different semiconductor types, e.g. MOSFET (metal-oxide-semiconductor field-effect transistor), IGBT (insulated-gate bipolar transistor), JFET (junction field-effect transistor), etc. it is not possible to actuate the different semiconductors separately with this assembly, because each type of semiconductor must have a separate actuation signal.

The object of the present invention is to overcome this problem. This problem is solved by the invention with the features of the independent claims. Advantageous embodiments are the subject matter of the dependent claims.

For this, a method for the momentary value-dependent actuation of a topological semiconductor switch for a power electronics system in real time is proposed, in which the topological semiconductor switch is divided into two groups of power semiconductors that are made of different semiconductor materials and/or different types of semiconductors. A switching threshold is also defined, at which switching from one group to another group, or adding at least one other group to the active group of topological semiconductor switches takes place in order to conduct the output electricity. Furthermore, data for at least one physical value that describes the operating state is also obtained and averaged. On the basis of this data and the switching threshold, it is determined which of the at least two groups of power semiconductors are to be actuated in order to conduct the output electricity.

By using physical values that are relevant to the system that is being operated, e.g. an electric motor in a vehicle, physical values relevant to the operation of the system, an averaging of the obtained values, and defining a switching threshold, the determination of which power semiconductor should be actuated for the required performance is improved, and a corresponding actuation signal is output. Consequently, different types of power semiconductors that are actuated independently and can also be made of different materials and/or have different designs, can be used to form a single topological switch. This results in an optimization of the actuation of the power semiconductors that are used in order to make better use of their properties.

The properties of different groups of power semiconductors can therefore be combined such that the groups support one another. This results in a higher level of efficiency.

In one embodiment, the switching threshold is defined on the basis of the operating point of the system. In an alternative embodiment, the switching threshold is defined through the use of a decision matrix. The decision matrix is advantageously based on a graph plotting the motor performance of an electric motor in a vehicle.

There is a hysteresis near the predefined switching threshold in one embodiment, which prevents toggling the actuation between two groups of power semiconductors.

In one embodiment, the semiconductor materials are selected from a group comprising at least Si, SiC, and GaN. In one embodiment, the semiconductor switches are transistors such as a MOSFET, IGBT, or JFET.

A computer program containing code for executing the method is also proposed, as well as a power electronics system containing a processor on which the program can be executed.

A power electronics system is also proposed, which contains an inverter. An electric drive for a vehicle containing the power electronics system and a vehicle containing the electric drive are also proposed.

Further features and advantages of the invention can be derived from the following description of exemplary embodiments of the invention in reference to the drawings showing details of the invention, and from the claims. The individual features can be realized in and of themselves or in numerous arbitrary combinations to obtain different variations of the invention.

Preferred embodiments of the invention shall be explained in greater detail below in reference to the drawings. Therein:

FIG. 1 shows an abstract illustration of the method for actuation of topological semiconductor switches based on momentary values according to one embodiment of the present invention; and FIGS. 2 and 3 show schematic illustrations of an implementation of the method according to embodiments of the present invention.

The reference symbols are used for identical elements and functions in the following description of the drawings.

Inverters, or power converters, require a power module or semiconductor package for converting direct current from a battery into alternating current. The power module contains topological switches with semiconductor transistors functioning as power transistors, which are used to control the currents and to generate the alternating current. Power transistors have numerous different designs. These include MOSFETS (metal-oxide-semiconductor field-effect transistor) and IGBTs (insulated-gate bipolar transistor). The semiconductor material used therein can be silicon (Si), silicon carbide (SiC), gallium nitride (GaN) or any other semiconductor material. Materials with a wide bandgap are preferred.

In order to comply with stricter fleet efficiency goals in the field of electric mobility, it is necessary to increase the efficiency of the inverter by using novel semiconductor technologies, e.g. SiC MOSFETs. The semiconductor surface for normal, e.g. average, driving is excessive, because the operating point of relevance is rarely reached. The problem is that the semiconductor surfaces in newer technologies (wide bandgap semiconductors (WGB)), which are more efficient, (e.g. SiC or GaN) are more expensive than conventional silicon. With conventional systems that contain semiconductors made of a less expensive material (e.g. silicon), the size can be determined on the basis of the operating point relevant to the design, allowing for safety margins, because the costs in relation the surface area of the semiconductor are relatively low compared to those for WGB materials. When WGB semiconductors are used in a conventional design, they not only take up more space, they are also more expensive. It is therefore necessary to find the optimal balance between the best possible technologies and the lowest costs.

For this reason, the semiconductors are designed by selecting the type of semiconductor and semiconductor material based on the application, i.e. the objective. Semiconductor transistors with silicon are more conductive with stronger currents, while semiconductor transistors with silicon carbide also exhibit this property with weaker currents. This is one way of optimizing the supply of power with respect to power consumption.

It has not yet been possible to actuate different power semiconductors connected in parallel that are made of different semiconductor materials and/or have different types of semiconductors with a single topological semiconductor switch. This would contribute, however, to an optimization of the use of the power semiconductor in question. To change this, the following method is proposed.

The invention results in method for operating point-dependent actuation of a topological semiconductor switch for a power electronics system, shown in an abstract form in FIG. 1. The topological semiconductor switch has at least two power semiconductors connected in parallel, in particular power transistors. The topological semiconductor switches are divided into at least two groups A, B, . . . , N. These groups are made of different semiconductor materials and/or different types of semiconductors. The semiconductor materials can be Si, SiC, GaN, etc. Semiconductor materials with a wide bandgap are advantageous. The types of semiconductors can be MOSFET, IGBT (with freewheeling diodes), RC-IGBT, JFET, etc. Groups A, B, . . . , N can also be cascode circuits. By way of example, one of the groups A, B can be a SiC MOSFET, and one of the other groups A, B, . . . , N can be a silicon IGBT with antiparallel freewheeling diodes.

The objective is to be able to actuate each of the groups A, B, . . . , N separately. A switching threshold 100 is defined for this, at which switching from one group A, B, . . . , N to another group A, B, . . . , N, or adding at least one other group A, B, . . . , N of the topological semiconductor switches, takes place in order to conduct the output electricity.

The switching threshold 100 can defined in different ways. In one embodiment, it is defined on the basis of the operating point of the system.

In another embodiment, it is defined through the use of a decision matrix. This decision matrix, with which it is decided which of the groups A, B, . . . , N is to be actuated, can be based on a graph mapping the motor performance of an electric motor in a vehicle. A limit value can be determined for this, at which one group A, B, . . . , N supplies the output power if a lower output power is needed, and the other group A, B, . . . , N supplies the output power when a higher output power is needed, i.e. when the limit value, or switching threshold, has been exceeded.

To determine which group A, B, . . . , N should be switched to, or actuated, input data containing at least one physical value S that describes the operating state of the system are recorded. This data is averaged, i.e. the average of the recorded input data over a predefined time period is obtained (P_out in FIGS. 2 and 3).

It is determined which of the at least two groups A, B, . . . , N of power semiconductors is actuated to conduct the output electricity on the basis of this data and the switching threshold 100. It is possible to actuate just one of the groups A, B, . . . , N. One or more of the other groups A, B, . . . , N can also be actuated, i.e. added thereto, to support the selected group.

The physical values S that are referenced for the actuation of the power semiconductors are advantageous values for the control or regulation, and/or monitoring, of the power electronics system.

These values S can be the current I, the effective value for the current I, or temperature, for example, any of which can also be further subdivided. By way of example, the temperature of the cooling water as it enters or exits the system, and/or the temperatures of the semiconductors can be referenced as the temperature. Furthermore, phase currents or battery currents, the charging state of the battery, voltage in the intermediate circuit, position of the gas pedal, and therefore the current power requirements, can also be referenced.

Processing these input signals S in order to decide which of the groups A, B, . . . , N should be actuated takes place with software, indicated in FIG. 1 as the processing block 1.

Control of the switching is shown in FIGS. 2 and 3 for when the signal P_out obtained from averaging the input signals S falls below (FIG. 2) and exceeds (FIG. 3) the predefined switching threshold 100. This is shown in the form of a graph plotting current I over time t. In this case, the effective value for the current I, which is proportional to the output electricity, is used to define the switching threshold 100.

Figure 1:
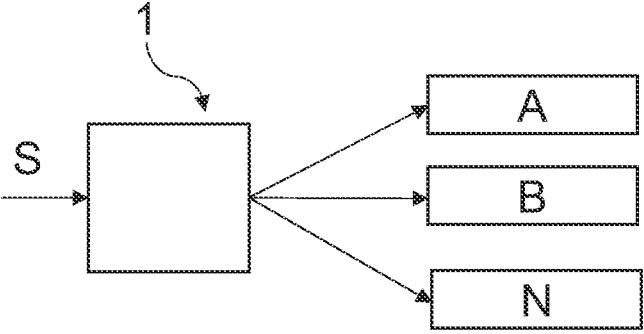
Figure 2:
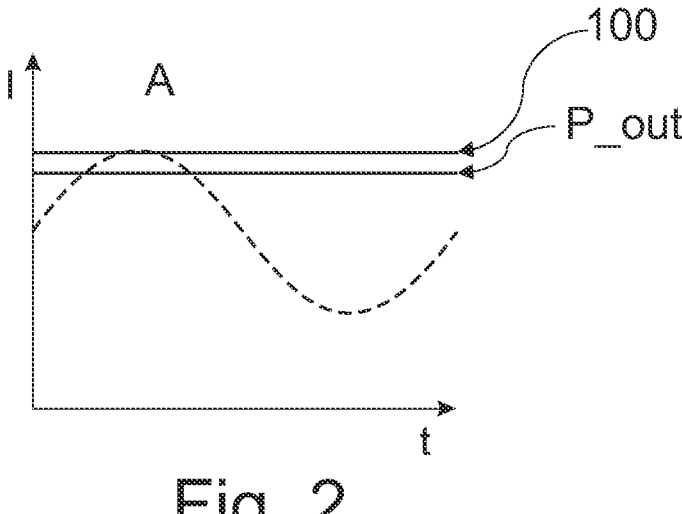
FIG. 2 shows a situation in which the average output electricity P_out, corresponding to the effective value for the phase current I, is lower than the predefined switching threshold 100, i.e. a predefined phase current I. Consequently, the entire current wave, i.e. all of the output electricity, is provided by a specific group, in this case group A.
Figure 3:
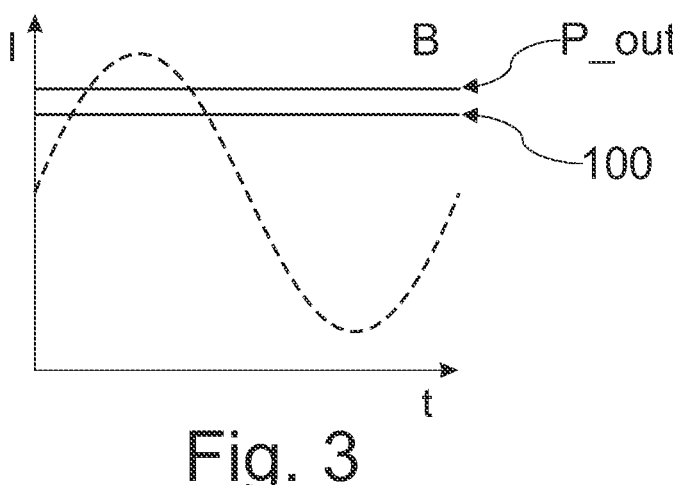
FIG. 3 shows a situation in which the average output electricity P_out, corresponding to the effective value for the phase current I, is higher than the predefined switching threshold 100, i.e. a predefined phase current I. Consequently, the entire current wave, i.e. all of the output electricity, is provided by a specific group, in this case group B.

Instead of switching from one group A, B, . . . , N to another group A, B, . . . , N, it is also possible to add at least one other group A, B, . . . , N to the active group A, B, . . . , N.

The actuator assembly can isolate the input side from the output side (not shown). This is obtained with a galvanic separation of a high voltage circuit from a low voltage circuit in the vehicle.

There can also be a hysteresis near the predefined switching threshold 100. A hysteresis can be used to prevent constant toggling between the groups A, B, . . . , N, i.e. a constant switching of different power semiconductors on and off due to brief moments in which the values exceed or fall below the limit values in two actuation patterns.

The invention advantageously includes a computer program containing code for executing the method. The power electronics system advantageously contains a processor on which the computer program can be executed. The method can be implemented with software, as the data processing speed requirements are low, i.e. there is no need for real-time detection, but instead, a so-called soft real-time detection is sufficient.

The method is therefore executed with a computing unit such as a control unit, which is advantageously part of the power electronics system. This carries out the computing operations, comparisons, etc. on the basis of the input signals S it receives.

The proposed method makes it possible to actuate groups A, B, . . . , N of different power semiconductors, with different semiconductor materials and/or types of semiconductors in a topological semiconductor switch, separately. This improves the efficiency of the control or regulation of the output electricity by the power electronics system. The proposed method can be used with inverters in the field of electric mobility, i.e. to control an electric drive.

LIST OF REFERENCE SYMBOLS

1 analog circuit

100 positive, negative switching thresholds

A, B, . . . , N power semiconductor groups

S input signal

I current t time

P_out averaged input signal

The invention claimed is:

1. A method for operating point-dependent actuation of a topological semiconductor switch for a power electronics system, wherein the topological semiconductor switch is divided into at least two groups of power semiconductors made of different semiconductor materials and/or types of semiconductors, and a switching threshold is defined, at which switching from one group to another a first group of the at least two groups of power semiconductors as an active switch group to a second group of the at least two groups of power semiconductors as the active switch group takes place in order to conduct output electricity, the method comprising:

averaging data from at least one physical value that describes an operating state of the power electronics system;

comparing the averaged data to the switching threshold; and determining, on a basis of the comparison of the averaged data and the switching threshold, to switch from the first group to the second group as the active switching group in order to conduct the output electricity.

2. The method according to claim 1, wherein the switching threshold is defined on a basis of an operating point for the system.

3. The method according to claim 1, wherein the switching threshold is defined through a use of a decision matrix.

4. The method according to claim 3, wherein the decision matrix is based on a graph plotting the motor performance of an electric motor in a vehicle.

5. The method according to claim 1, wherein the predefined switching threshold includes a hysteresis near the predefined switching threshold.

6. The method according to claim 1, wherein the semiconductor materials that can be used for the power semiconductors comprise at least Si, SiC, or GaN.

7. The method according to claim 1, wherein the types of semiconductors that can be used for the power semiconductors comprise at least MOSFET, IGBT, or JFET.

8. A non-transitory computer readable medium having stored thereon computer program containing code that, when executed by a processor, cause the processor to execute a method for operating point-dependent actuation of a topological semiconductor switch for a power electronics system, wherein the topological semiconductor switch is divided into at least two groups of power semiconductors made of different semiconductor materials and/or types of semiconductors, and a switching threshold is defined, at which switching from a first group of the at least two groups of power semiconductors as an active switch group to a second group of the at least two groups of power semiconductors takes place in order to conduct output electricity, the method comprising:

averaging data from at least one physical value that describes an operating state of the power electronics system;

comparing the averaged data to the switching threshold; and determining, on a basis of the comparison of the averaged data and the switching threshold, to switch from the first group to the second group as the active switching group in order to conduct the output electricity.

9. A power electronics system comprising:
a processor configured to execute the computer program
  stored on the non-transitory computer readable medium
  according to claim 8.

10. An electric drive for a vehicle, comprising:
the power electronics system according to claim 9 for
  controlling the electric drive.

11. A vehicle comprising:
the electric drive according to claim 10.

* * * * *